(12) United States Patent
Yu et al.

(10) Patent No.: US 9,754,805 B1
(45) Date of Patent: Sep. 5, 2017

(54) PACKAGING METHOD AND STRUCTURE

(71) Applicant: Taiwan Semiconductor Manufacturing Company, Ltd., Hsin-Chu (TW)

(72) Inventors: Chen-Hua Yu, Hsin-Chu (TW); Ching-Hua Hsieh, Hsin-Chu (TW); Chung-Shi Liu, Hsin-Chu (TW); Ming-Da Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/053,161

(22) Filed: Feb. 25, 2016

(51) Int. Cl.
*H01L 21/00* (2006.01)
*H01L 21/56* (2006.01)
*H01L 21/48* (2006.01)
*H01L 21/768* (2006.01)

(52) U.S. Cl.
CPC ............ *H01L 21/56* (2013.01); *H01L 21/486* (2013.01); *H01L 21/4846* (2013.01); *H01L 21/76814* (2013.01); *H01L 21/76877* (2013.01)

(58) Field of Classification Search
CPC H01L 21/56; H01L 21/4846; H01L 21/76877
See application file for complete search history.

(56) References Cited

U.S. PATENT DOCUMENTS

| 7,407,731 | B2 | 8/2008 | Naiini et al. |
| 8,361,842 | B2 * | 1/2013 | Yu .................... H01L 21/561 |
| | | | 257/E21.499 |
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |

(Continued)

OTHER PUBLICATIONS

"Introduction to Compression Molding," eFunda, http://www.efunda.com/processes/plastic_molding_compression.cfm, 2015, downloaded on Feb. 24, 2016, 2 pages.

(Continued)

*Primary Examiner* — Laura Menz
(74) *Attorney, Agent, or Firm* — Slater Matsil, LLP

(57) ABSTRACT

A system and method for manufacturing a semiconductor device are provided. In an embodiment a first semiconductor device and a second semiconductor device are encapsulated with an encapsulant. A dielectric layer is formed over the encapsulant, the first semiconductor device, and the second semiconductor device. The dielectric layer is planarized in order to reset the planarity of the dielectric layer.

20 Claims, 15 Drawing Sheets

(56) References Cited

U.S. PATENT DOCUMENTS

2014/0252646 A1    9/2014  Hung et al.
2014/0264930 A1*   9/2014  Yu ......................... H01L 24/19
                                                              257/774

OTHER PUBLICATIONS

"Introduction to Transfer Molding," eFunda, http://www.efunda.com/processes/plastic_molding_transfer.cfm, 2015, downloaded on Feb. 24, 2016, 3 pages.

"Transfer Molding," Wikipedia, https://en.wikipedia.org/wiki/Transfer_molding, last modified on Aug. 5, 2015, downloaded on Feb. 24, 2016, 2 pages.

"Compression Molding," Wikipedia, https://en.wikipedia.org/wiki/Compression_molding, last modified on Aug. 12, 2015, downloaded on Feb. 24, 2016, 4 pages.

* cited by examiner

PACKAGING METHOD AND STRUCTURE

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are utilized.

In an attempt to further increase circuit density, integrating separate chips into one or more packages has been investigated. However, such integration has led to multiple issues being identified. As such, in order to continue to further integrate multiple chips into the same package and also to help reduce the size of the overall device, additional improvements in the manufacturing process are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
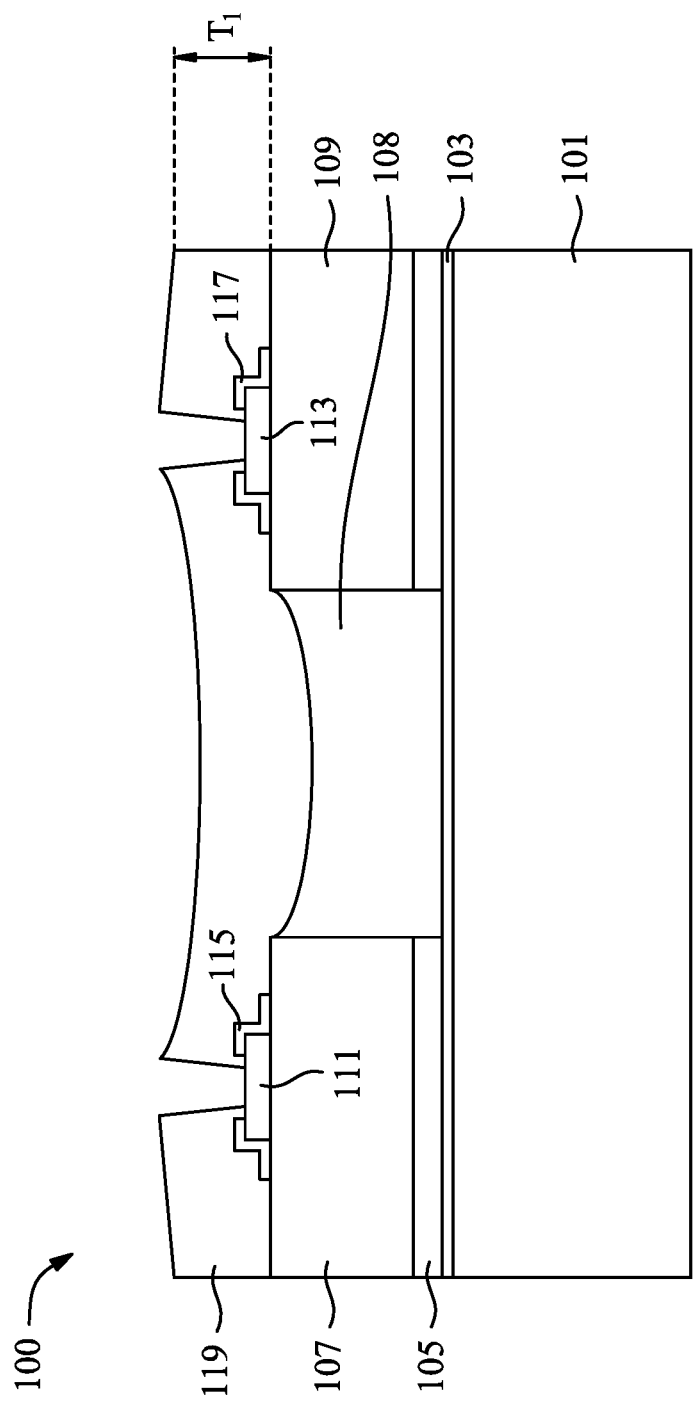
FIG. 1 illustrates an encapsulation of a first semiconductor device and a second semiconductor device with an encapsulant in accordance with some embodiments.

The following disclosure provides many different embodiments, or examples, for implementing different features of embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated an intermediate product in a process of forming, e.g., a package 100. As illustrated in FIG. 1, the intermediate structure comprises a carrier substrate 101, a temporary adhesive layer 103, a die attach film (DAF) 105, a first semiconductor device 107, a second semiconductor device 109, a first contact pad 111, a second contact pad 113, a first passivation layer 115, and a second passivation layer 117. The carrier substrate 101 comprises, for example, silicon based materials, such as glass or silicon oxide, or other materials, such as aluminum oxide, combinations of any of these materials, or the like. The carrier substrate 101 is planar in order to accommodate an attachment of semiconductor devices such as the first semiconductor device 107 and the second semiconductor device 109.

The temporary adhesive layer 103 is placed on the carrier substrate 101 in order to assist in the adherence of overlying structures (e.g., the DAF 105). In an embodiment the temporary adhesive layer 103 may comprise a light-to-heat conversion (LTHC) layer or an ultra-violet glue, which loses its adhesive properties when exposed to ultra-violet light. However, other types of adhesives, such as pressure sensitive adhesives, radiation curable adhesives, epoxies, combinations of these, or the like, may also be used. The temporary adhesive layer 103 may be placed onto the carrier substrate 101 in a semi-liquid or gel form, which is readily deformable under pressure.

Once the temporary adhesive layer 103 has been placed, the first semiconductor device 107 and the second semiconductor device 109 may be placed onto the carrier substrate 101 using, e.g., the DAF 105. In an embodiment the DAF 105 is placed over the backside of the first semiconductor device 107 and the second semiconductor device 109 and is utilized in order to provide additional adhesion. In an embodiment the DAF 105 is an epoxy resin, a phenol resin, acrylic rubber, silica filler, or a combination thereof, and is applied using a lamination technique. However, any other suitable alternative material and method of formation may alternatively be utilized.

Once the DAF 105 has been applied to the first semiconductor device 107 and the second semiconductor device 109, the first semiconductor device 107 and the second semiconductor device 109 may be placed onto the carrier substrate 101. In an embodiment the first semiconductor device 107 and the second semiconductor device 109 may each be a semiconductor device designed for an intended purpose such as being a logic die, a central processing unit (CPU) die, a memory die, combinations of these, or the like. In an embodiment the first semiconductor device 107 and the second semiconductor device 109 comprise integrated circuit devices, such as transistors, capacitors, inductors, resistors, first metallization layers (not shown), and the like, therein, as desired for a particular functionality. In an embodiment the first semiconductor device 107 and the second semiconductor device 109 are designed and manufactured to work in conjunction with or concurrently with each other, although they may alternatively be designed to work separately from each other. In another embodiment, the first semiconductor device 107 and the second semiconductor device 109 may also be the same as each other, providing identical functionalities.

The first contact pad 111 is manufactured on the first semiconductor device 107 to form electrical connections between the first semiconductor device 107 and, e.g., first external connections (not illustrated). In an embodiment the first contact pad 111 may be formed over and in electrical contact with electrical routing (not separately illustrated in FIG. 1) within the first semiconductor device 107. The first contact pad 111 may comprise aluminum, but other materials, such as copper, may alternatively be used. The first contact pad 111 may be formed using a deposition process, such as sputtering, to form a layer of material (not shown) and portions of the layer of material may then be removed through a suitable process (such as photolithographic masking and etching) to form the first contact pad 111. However, any other suitable process may be utilized to form the first contact pad 111. The first contact pad 111 may be formed to have a thickness of between about 0.5 μm and about 4 μm, such as about 1.45 μm.

To protect the first contact pad 111, the first passivation layer 115 may be formed. The first passivation layer 115 may be formed over the first contact pad 111, and may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 115 may be formed through a process such as chemical vapor deposition (CVD), although any suitable process may be utilized, and may have a thickness between about 0.5 μm and about 5 μm, such as about 9.25 KÅ.

After the first passivation layer 115 has been formed, an opening may be made through the first passivation layer 115 by removing portions of the first passivation layer 115 to expose at least a portion of the underlying first contact pad 111. The opening allows for contact between the first contact pad 111 and, e.g., an overlaying first redistribution layer 401 (not illustrated in FIG. 1 but illustrated and discussed further below with respect to FIG. 4). The opening may be formed using a suitable photolithographic mask and etching process, although any suitable process to expose portions of the first contact pad 111 may be used.

The second contact pad 113 and the second passivation layer 117 may be formed on the second semiconductor device 109 using similar materials and methods as described above with respect to the first contact pad 111 and the first passivation layer 115. For example, the second contact pad 113 may be an aluminum contact pad formed using a deposition process, and the second passivation layer 117 may be formed using a deposition process and then a patterning process to expose a portion of the second contact pad 113. However, any suitable method of manufacture may alternatively be utilized.

However, as one of ordinary skill in the art will recognize, the inclusion of only two semiconductor devices (e.g., the first semiconductor device 107 and the second semiconductor device 109) and the illustration of a single contact pad on each one of the first semiconductor device 107 and the second semiconductor device 109 is intended to be illustrative and is not intended to be limiting. Rather, any suitable number of semiconductor devices, with any suitable number of contact pads or other connectors, may also be utilized. All such configurations are fully intended to be included within the scope of the embodiments.

Once attached to the carrier substrate 101, the first semiconductor device 107 and the second semiconductor device 109 may be encapsulated with an encapsulant 108 in order to provide protection as well as to provide another surface for further processing (described further below). In an embodiment the encapsulant 108 may be a molding compound and may be placed using, e.g., a transfer or laminate molding process. However, such a laminate process will also, because of the placement of the encapsulant 108 between the first semiconductor device 107 and the second semiconductor device 109, cause planarity related issues along a surface of the encapsulant 108.

In an embodiment using the transfer or laminate molding process, the transfer molding process may be started by initially placing the first semiconductor device 107 and the second semiconductor device 109 within a cavity of a molding device (not illustrated in FIG. 1), and the cavity may be sealed. Once the first semiconductor device 107 and the second semiconductor device 109 are within the cavity, the material of the encapsulant 108 may be loaded into a pot and heated until it liquefies, at which point pressure may be applied to the material of the encapsulant 108 through, e.g., a piston, in order to force the now liquid encapsulant 108 through an opening within either a sidewall or top of the cavity and around and between the first semiconductor device 107 and the second semiconductor device 109. In an embodiment the encapsulant 108 may be a molding compound resin such as polyimide, PPS, PEEK, PES, a heat resistant crystal resin, combinations of these, or the like.

Once the encapsulant 108 has been forced into the cavity such that the encapsulant 108 encapsulates the region around and between the first semiconductor device 107 and the second semiconductor device 109, the encapsulant 108 may be cured in order to harden the encapsulant 108 for optimum protection. While the exact curing process is dependent at least in part on the particular material chosen for the encapsulant 108, in an embodiment in which molding compound is chosen as the encapsulant 108, the curing could occur through a process such as heating the encapsulant 108 to between about 100° C. and about 200° C., such as about 150° C. for about 30 minutes to about 2400 minutes, such as about 60 minutes. Additionally, initiators and/or catalysts may be included within the encapsulant 108 to better control the curing process.

However, as one having ordinary skill in the art will recognize, the curing process described above is merely an exemplary process and is not meant to limit the current embodiments. Other curing processes, such as irradiation or even allowing the encapsulant 108 to harden at ambient temperature, may alternatively be used. Any suitable curing process may be used, and all such processes are fully intended to be included within the scope of the embodiments discussed herein.

However, because of the transfer molding process, the first semiconductor device 107, the second semiconductor device 109, and the encapsulant 108 do not finish the encapsulation process being planar with each other. In some embodiments, a top surface of the encapsulant 108 will have an uneven shape extending from the first semiconductor device 107 to the second semiconductor device 109. Such a non-planar surface can lead to problems and defects during the manufacturing of subsequent, overlying layers.

FIG. 1 also illustrates a placement of a first dielectric layer 119 over the first semiconductor device 107 and the second semiconductor device 109. In an embodiment the first dielectric layer 119 may be a photosensitive polybenzoxazole (PBO), although any other suitable material, such as polyimide, BCB, epoxy, silicone, acrylate, phenol resin, siloxane, fluorinated polymer, or polynorbornene, may alternatively be applied. In an embodiment in which the first dielectric layer 119 is photosensitive PBO, the photosensitive PBO may be applied using, e.g., a spin coating process, a dry-film lamination process, a spray coating process, a blade coating process, or the like and may have a first thickness $T_1$ over the first semiconductor device 107 and the second semiconductor device 109 of between about 3 µm and about 15 µm, such as about 10 µm.

However, as can be seen in FIG. 1, with the presence of the encapsulant 108 that is not planar, and also with the presence of the first contact pad 111, the second contact pad 113, the first passivation layer 115 and the second passivation layer 117, the top surface of the first dielectric layer 119 also has a non-planar shape that is curved at various points. Such an uneven topography of the first dielectric layer 119 will work to limit the patterning capability of overlying layers (such as the first redistribution layer 401 discussed further below with respect to FIG. 4) as dimensions are further reduced into the sub-micron regime.

Once placed over the first semiconductor device 107 and the second semiconductor device 109, the first dielectric layer 119 may be patterned and developed in order to expose portions of the first contact pad 111 and the second contact pad 113. In an embodiment in which the first dielectric layer 119 in photosensitive PBO, the patterning may be performed by initially exposing the first dielectric layer 119 to an energy source to form an exposed region and an unexposed region within the first dielectric layer 119. In an embodiment the exposure may be initiated by placing the first semiconductor device 107 and the second semiconductor device 109 (with the first dielectric layer 119) into an imaging device (not separately illustrated in FIG. 1) for exposure. The imaging device may comprise a support plate, an energy source, a patterned mask between the support plate and the energy source, and various optics. In an embodiment the support plate is a surface to which the first semiconductor device 107 and the second semiconductor device 109 may be placed or attached to and which provides support and control to the first semiconductor device 107 and the second semiconductor device 109 during exposure of the first dielectric layer 119. Additionally, the support plate may be movable along one or more axes, as well as providing any desired heating or cooling to the first semiconductor device 107 and the second semiconductor device 109 in order to prevent temperature gradients from affecting the exposure process.

In an embodiment the energy source supplies energy such as light to the first dielectric layer 119 in order to induce a reaction within the first dielectric layer 119, which chemically alters those portions of the first dielectric layer 119 to which the energy impinges. In an embodiment the energy may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy, such as mercury vapor lamps, xenon lamps, carbon arc lamps or the like, may alternatively be utilized.

The patterned mask is located between the energy source and the first dielectric layer 119 in order to block portions of the energy to form a patterned energy prior to the energy actually impinging upon the first dielectric layer 119. In an embodiment the patterned mask may comprise a series of layers (e.g., substrate, absorbance layers, anti-reflective coating layers, shielding layers, etc.) to reflect, absorb, or otherwise block portions of the energy from reaching those portions of the first dielectric layer 119 which are not desired to be illuminated. The desired pattern may be formed in the patterned mask by forming openings through the patterned mask in the desired shape of illumination.

Optics may be used to concentrate, expand, reflect, or otherwise control the energy as it leaves the energy source, is patterned by the patterned mask, and is directed towards the first dielectric layer 119. In an embodiment the optics comprise one or more lenses, mirrors, filters, combinations of these, or the like to control the energy along its path. Elements of the optics (e.g., individual lenses, mirrors, etc.) may also be located at any location between the energy source (where the energy is generated) and the first dielectric layer 119.

In an embodiment the first semiconductor device 107 and the second semiconductor device 109 are placed on the support plate. Once the pattern has been aligned to the first semiconductor device 107 and the second semiconductor device 109, the energy source generates the desired energy (e.g., light) which passes through the patterned mask and the optics on its way to the first dielectric layer 119. The patterned energy impinges upon portions of the first dielectric layer 119, chemically altering the first dielectric layer 119 in those portions that were illuminated through the patterned mask.

Once exposed the first dielectric layer 119 is developed in order to separate the exposed region from the unexposed region. In an embodiment the first dielectric layer 119 is developed using, e.g., a developer (not separately illustrated in FIG. 1), such as an aqueous basic developer such as tetramethylammonium hydroxide (TMAH). Alternatively, the developer may comprise a base in an aqueous solution such as an inorganic alkali such as potassium hydroxide, sodium hydroxide, or ammonia water. Alternatively, a primary amine such as ethylamine or n-propylamine, a secondary amine such as diethylamine or di-n-propylamine, a tertiary amine such as triethylamine, an alcoholamine such as triethanolamine, a quaternary ammonium salt such as tetraethylammonium hydroxide, combinations of these, and the like may be utilized.

Additionally, after the first dielectric layer 119 has been developed, the first dielectric layer 119 may be cured in order to harden the first dielectric layer 119. While the exact curing process is dependent at least in part on the particular material chosen for the first dielectric layer 119, in an embodiment in which photosensitive polybenzoxazole is utilized as the first dielectric layer 119, the curing could occur through a process such as heating the first dielectric layer 119 to between about 150° C. and about 350° C., such as about 230° C. for about 1800 sec to about 14400 sec, such as about 3600 sec.

However, as one having ordinary skill in the art will recognize, the curing process described above is merely an exemplary process and is not meant to limit the current embodiments. Other curing processes, such as irradiation or even allowing the encapsulant 108 to harden at ambient temperature, may alternatively be used. Any suitable curing process may be used, and all such processes are fully intended to be included within the scope of the embodiments discussed herein.

However, as illustrated in FIG. 1, when the first dielectric layer 119 is placed over the first semiconductor device 107 (with the first contact pad 111), the second semiconductor device 109 (with the second contact pad 113), and the encapsulant 108, the unevenness of these surfaces will cause the top surface of the first dielectric layer 119 to also be uneven and not be planar. Such unevenness can cause problems during the application and manufacturing of overlying layers.

Figure 2:
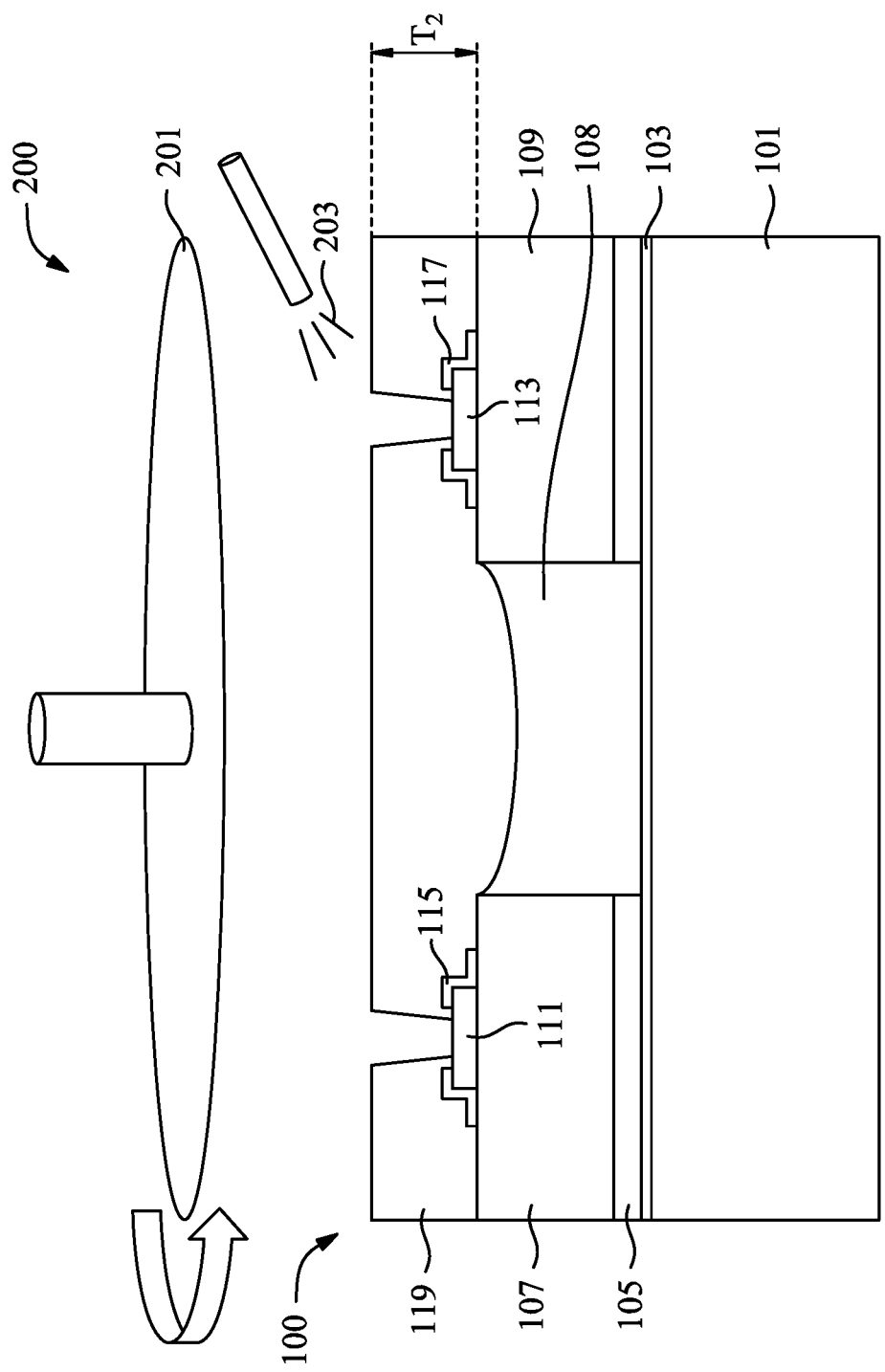
FIG. 2 illustrates a planarization of a dielectric layer over the encapsulant in accordance with some embodiments.

As such, FIG. 2 illustrates a first planarization process (represented in FIG. 2 by the label 200) of the first dielectric layer 119 after the patterning of the first dielectric layer 119. In an embodiment the first planarization process 200 may be performed using, e.g., a chemical mechanical polishing (CMP) process whereby an abrasive platen 201 may, e.g., be rotatably applied to the first dielectric layer 119 in order to mechanically grind and remove the first dielectric layer 119. In an embodiment the platen may be rotated at a speed of between about 20 rpm and about 600 rpm, such as about 100 rpm.

In order to assist in the removal process, a CMP slurry 203 may additionally be added in addition to the simple grinding process of the platen 201. In an embodiment the CMP slurry 203 may comprise abrasives such as silica, alumina and ceria which will work in conjunction with the platen 201 to grind and remove the first dielectric layer 119. The abrasives within the CMP slurry 203 may have a concentration of between about 0.2% and about 5%, such as about 0.5%, although any suitable combination may alternatively be utilized.

Additionally, a chemical reactant may be added to the CMP slurry 203 in order to help react the first dielectric layer 119 into a material which is more easily removable by the platen 201 and the abrasives. As such, while the material of the chemical reactant is dependent at least in part upon the material chosen for the first dielectric layer 119, in an embodiment in which the first dielectric layer 119 is a photosensitive PBO, the chemical reactant may be a reactant such as hydrogen peroxide at a concentration of less than about 5%, such as about 0.5%. However, any suitable reactants at any suitable concentration may alternatively be utilized.

However, while the CMP process that utilizes the platen 201 and the CMP slurry 203 is described above, this description is intended to be illustrative and is not intended to be limiting. Rather, any suitable planarization process, such as a physical grinding process (without the CMP slurry 203 described above) or a series of one or more etches, may alternatively be utilized. Any suitable process to planarize the first dielectric layer 119 may be used, and all such processes are fully intended to be included within the scope of the embodiments.

In an embodiment the first planarization process 200 is utilized to planarize the first dielectric layer 119 and effectively reset the planarity of the structure. As such, the planarization process removes the material of the first dielectric layer 119 (and reduces the thickness of the first dielectric layer 119) until a desired degree of planarity is reached, such as by reducing the unevenness of the first dielectric layer 119 until the first dielectric layer 119 has a planarity (the difference in topography at the surface of the first dielectric layer 119 as by measured by, e.g., an alpha-step profiler or optical profiler) of less than about 5 µm, such as about 1 µm. In an embodiment the planarization process may be continued until the first dielectric layer 119 has a second thickness $T_2$ of between about 0.5 µm and about 10 µm, such as about 5 µm.

Figure 3:
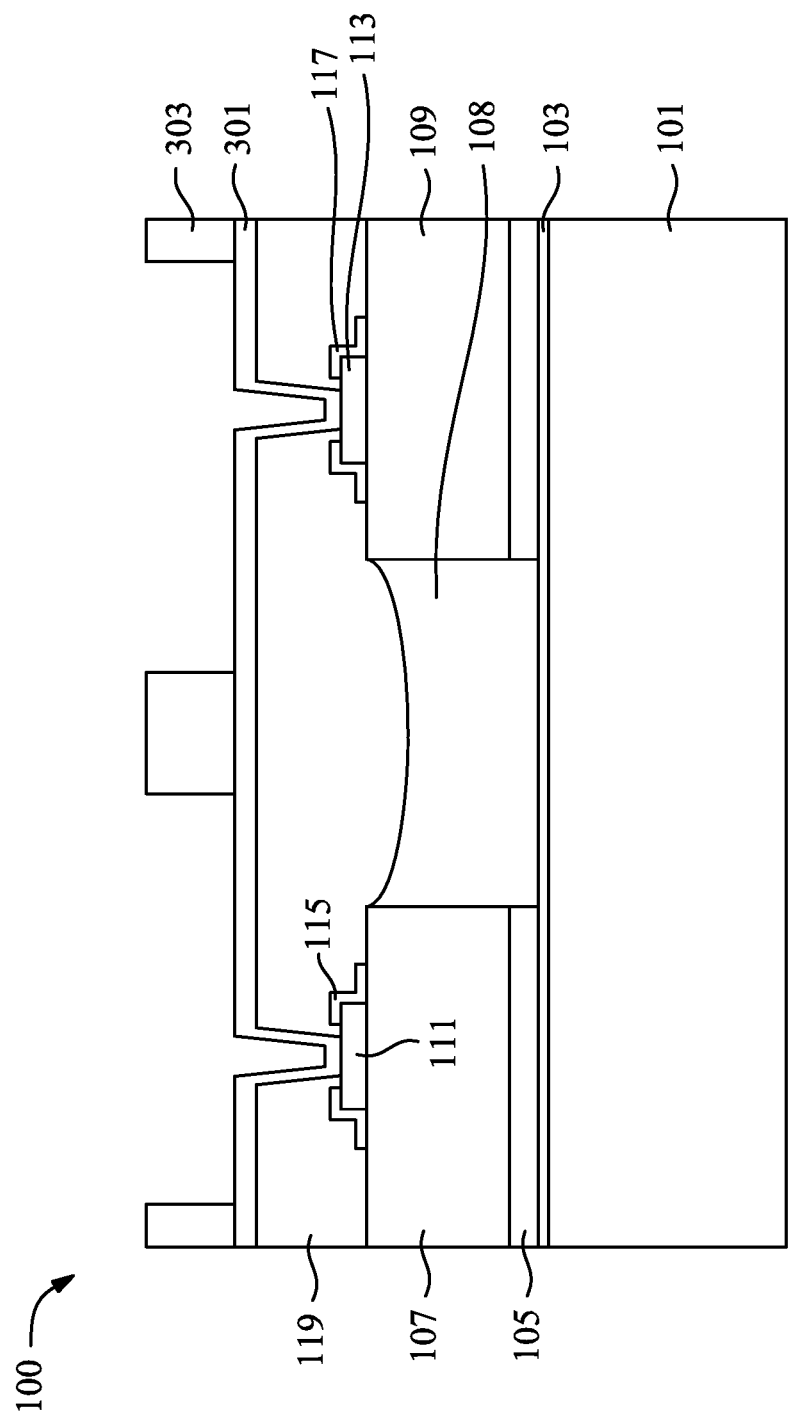
FIG. 3 illustrates a seed layer and a first photoresist in accordance with some embodiments.

FIG. 3 illustrates that, once the first dielectric layer 119 has been planarized, a first seed layer 301 and a first photoresist 303 are formed over the first dielectric layer 119. In an embodiment an optional plasma ashing cleaning process may be utilized prior to the formation of the first seed layer 301 in order to clean and prepare the first dielectric layer 119 to receive the first seed layer 301. The plasma ashing cleaning process may be performed by generating a plasma from a cleaning precursor such as oxygen or the like and then exposing the first dielectric layer 119 to the plasma within an inert environment such as nitrogen, argon, or the like. However, any suitable cleaning process may alternatively be utilized.

The first seed layer 301 is a thin layer of a conductive material that aids in the formation of a thicker layer during subsequent processing steps. The first seed layer 301 may comprise a layer of titanium about 700 Å thick followed by a layer of copper about 3,000 Å thick. The first seed layer 301 may be created using processes such as sputtering, evaporation, or PECVD processes, depending upon the desired materials. The first seed layer 301 may be formed to have a thickness of between about 0.1 µm and about 0.7 µm, such as about 0.4 µm.

Once the first seed layer 301 has been formed, the first photoresist 303 may be placed and patterned over the first seed layer 301. In an embodiment the first photoresist 303 may be placed on the first seed layer 301 using, e.g., a spin coating technique to a height of between about 1 µm and about 15 µm, such as about 7 µm. Once in place, the first photoresist 303 may then be patterned by exposing the first photoresist 303 to a patterned energy source (e.g., a patterned light source) so as to induce a chemical reaction, thereby inducing a physical change in those portions of the first photoresist 303 exposed to the patterned light source. A developer is then applied to the exposed first photoresist 303 to take advantage of the physical changes and selectively remove either the exposed portion of the first photoresist 303 or the unexposed portion of the first photoresist 303, depending upon the desired pattern.

In an embodiment the pattern formed into the first photoresist 303 is a pattern that will be utilized to form a first redistribution layer (RDL) 401 (not illustrated in FIG. 3 but illustrated and discussed further with respect to FIG. 4) on the first seed layer 301. As such, the first photoresist 303 may be patterned to expose portions of the first seed layer 301, including portions of the first seed layer 301 that extend through the first dielectric layer 119 to make electrical contact with the first contact pad 111.

Figure 4:
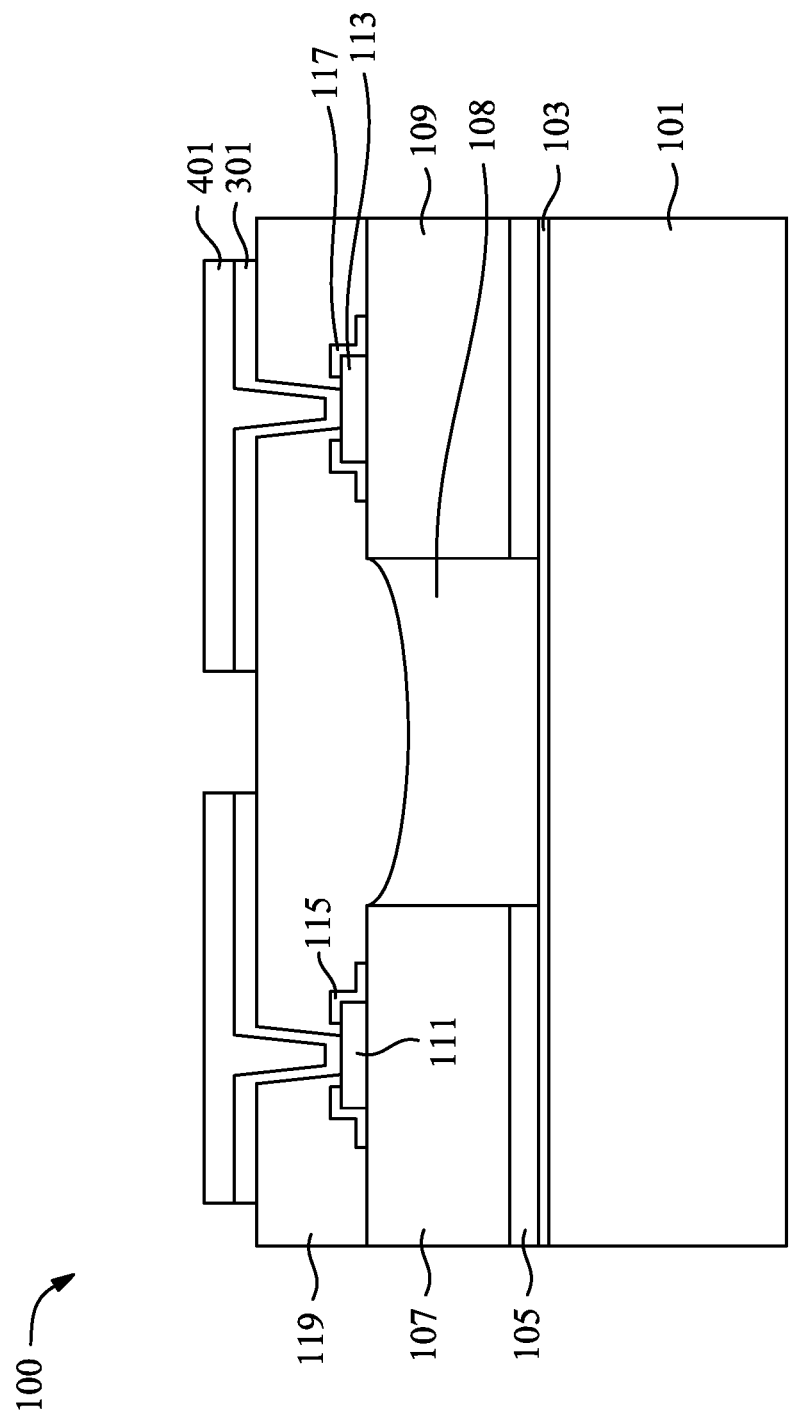
FIG. 4 illustrates a formation of redistribution layer in accordance with some embodiments.

FIG. 4 illustrates that, once the first photoresist 303 has been patterned, the first redistribution layer 401 is formed on the first seed layer 301 within the first photoresist 303. In an embodiment the first redistribution layer 401 comprises one or more conductive materials, such as copper, tungsten, other conductive metals, or the like, and may be formed, for example, by electroplating, electroless plating, or the like. In an embodiment, an electroplating process is used wherein the first seed layer 301 and the first photoresist 303 are submerged or immersed in an electroplating solution. The first seed layer 301 surface is electrically connected to the negative side of an external DC power supply such that the first seed layer 301 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 301, acquires the dissolved atoms, thereby plating the exposed conductive areas of the first seed layer 301 within the opening of the first photoresist 303.

Once the first redistribution layer 401 has been formed using the first photoresist 303 and the first seed layer 301, the first photoresist 303 may be removed using a suitable removal process. In an embodiment, a plasma ashing process may be used to remove the first photoresist 303, whereby the temperature of the first photoresist 303 may be increased until the first photoresist 303 experiences a thermal decomposition and may be removed. However, any other suitable process, such as a wet strip, may alternatively be utilized. The removal of the first photoresist 303 may expose the underlying portions of the first seed layer 301.

After the removal of the first photoresist 303 exposes the underlying first seed layer 301, these portions of the first seed layer 301 are removed. In an embodiment the exposed portions of the first seed layer 301 (e.g., those portions that are not covered by the first redistribution layer 401) may be removed by, for example, a wet or dry etching process. For example, in a dry etching process reactants may be directed towards the first seed layer 301, using the first redistribution layer 401 as a mask. Alternatively, etchants may be sprayed or otherwise put into contact with the first seed layer 301 in order to remove the exposed portions of the first seed layer 301.

After the first redistribution layer 401 has been formed, additional manufacturing may be performed over the first redistribution layer 401. In an embodiment, a third passivation layer may be formed to cover and protect the first redistribution layer 401, openings may be formed to portions of the first redistribution layer 401, and external contacts such as solder balls or copper pillars may be placed in electrical connection with the first redistribution layer 401 to provide electrical connection to external devices such as printed circuit boards or other packages with other semiconductor devices.

Additionally, the carrier substrate 101 may be removed and further processing may be performed on an opposite side of the first semiconductor device 107 and the second semiconductor device 109 from the first redistribution layer 401. For example, additional metallization and redistribution layers may be formed over the back side of the first semiconductor device 107 and the second semiconductor device 109, and external connections may be formed in physical or electrical connection with the additional metallization and redistribution layers over the back side of the first semiconductor device 107 and the second semiconductor device 109. Finally, if desired, a singulation process may be performed in order to separate the first semiconductor device 107 and the second semiconductor device 109, or they may be left unsingulated. However, any suitable processing may be performed, and all such processing is fully intended to be included within the scope of the embodiments.

Additionally, by resetting the planarity of the first dielectric layer 119, overlying structures will also be formed on a more planar surface. As such, defects that would normally be caused by the non-planarity of the underlying surface can be avoided and finer lines can be realized (such as finer redistribution lines). With fewer defects, a more reliable process can be formed, and larger yields can be realized.

Figure 5:
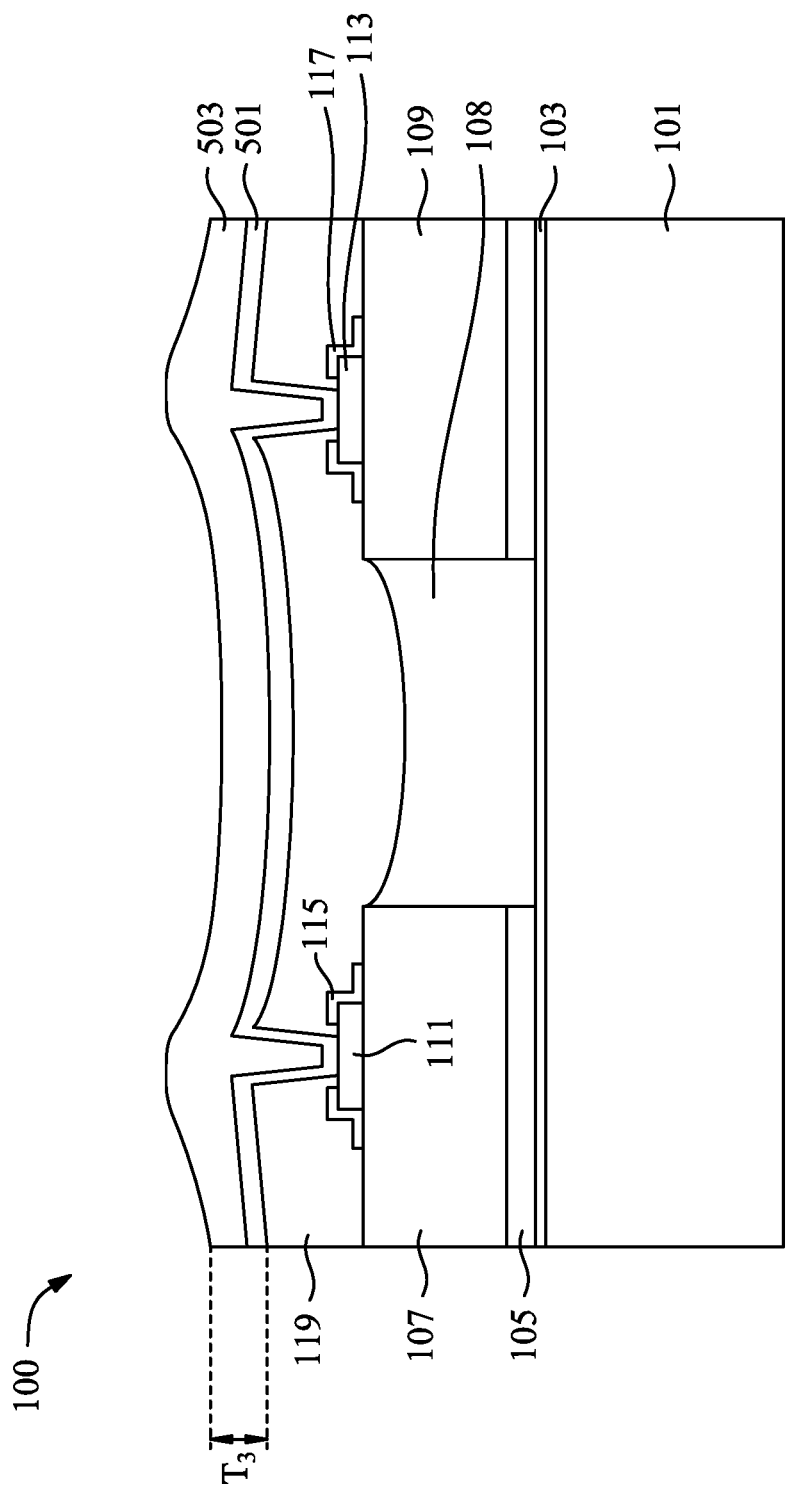
FIG. 5 illustrates a formation of a conductive material over the dielectric layer in accordance with some embodiments.

FIG. 5 illustrates another embodiment that may be utilized to compensate for an uneven first dielectric layer 119. In this embodiment, once the encapsulant 108 has been applied (using, e.g., the transfer or lamination molding process), the first dielectric layer 119 may be applied over the first semiconductor device 107, the second semiconductor device 109, and the encapsulant 108 and then patterned, cured, and cleaned (with e.g., a plasma ashing process) to expose the first contact pad 111 and the second contact pad 113. However, the unevenness caused by the step height created by the first contact pad 111, the second contact pad 113, the first passivation layer 115, and the second passivation layer 117 causes further unevenness in the overlying first dielectric layer 119 after the first dielectric layer 119 has been applied.

In this embodiment the unevenness is mitigated by initially forming a second seed layer 501 and a first conductive material 503 over the first dielectric layer 119 after the plasma cleaning process and prior to resetting the planarity of the first dielectric layer 119. In an embodiment the second seed layer 501 may be formed to line the openings through the first dielectric layer 119 to the first contact pad 111 and the second contact pad 113, and may be formed of similar material and using similar processes as the first seed layer 301. For example, the second seed layer 501 may be a layer of titanium followed by a layer of copper formed using a process such as sputtering. However, any suitable material and process may alternatively be utilized.

Once the second seed layer 501 has been formed, the first conductive material 503 may be formed on the second seed layer 501. In an embodiment the first conductive material 503 may be formed of a similar material and using similar processes as the first redistribution layer 401 (not illustrated in FIG. 5 but illustrated and described above with respect to FIG. 4). For example, the first conductive material 503 may be formed of a material such as copper using a process such as electroplating or electroless plating. However, any suitable material and process may alternatively be utilized to form the first conductive material 503.

In an embodiment the first conductive material 503 is deposited to completely fill the openings through the first dielectric layer 119 to the first contact pad 111 and the second contact pad 113. Additionally, to ensure a complete filling of the openings to the first contact pad 111 and the second contact pad 113, the first conductive material 503 may be deposited to overfill the openings and also form a layer over the first dielectric layer 119. In an embodiment the first conductive material 503 may be deposited to a third thickness $T_3$ over the first dielectric layer 119 of between about 0.05 µm and about 7 µm, such as about 4 µm, although any suitable thickness may be utilized.

Figure 6:
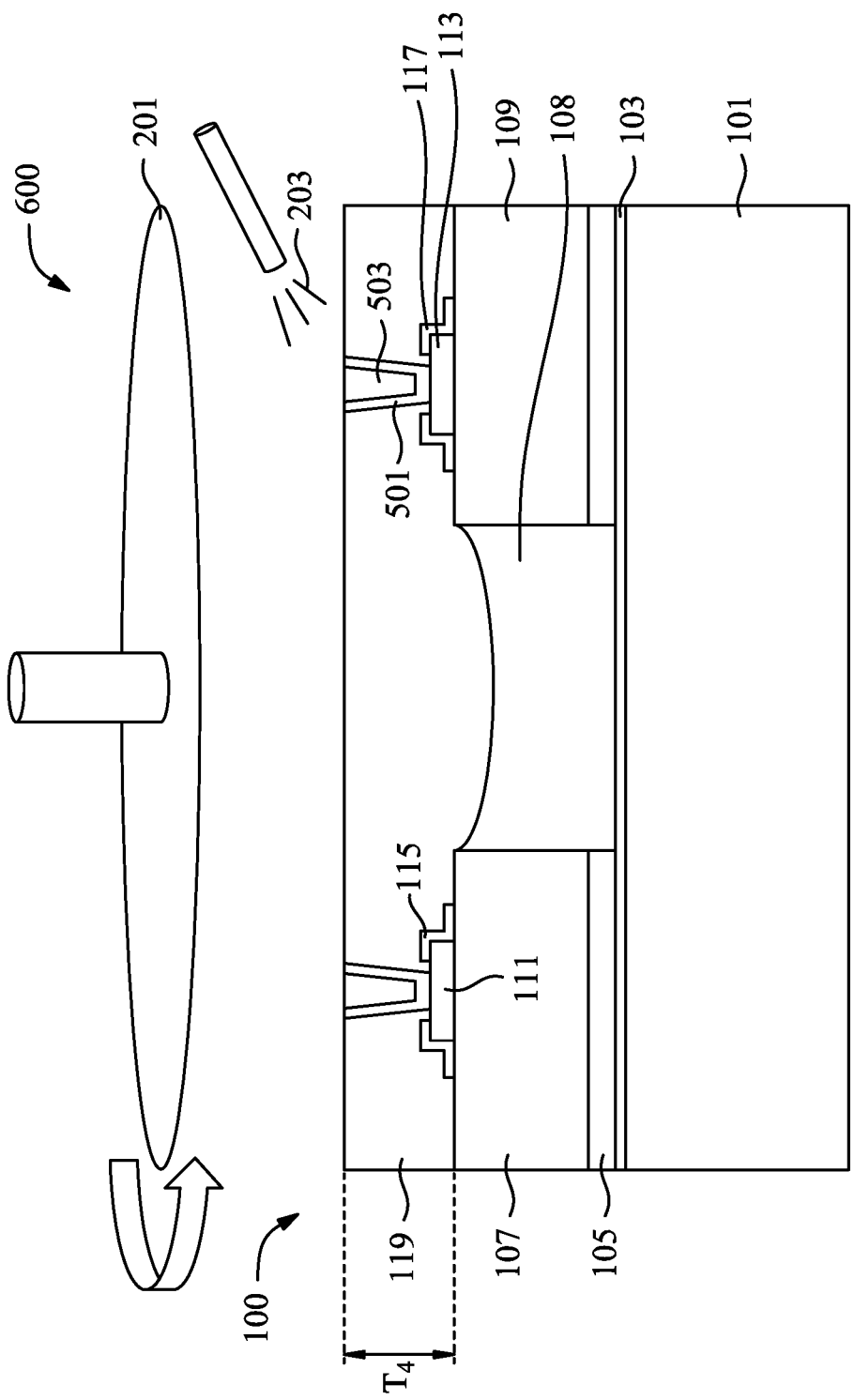
FIG. 6 illustrates a planarization of the conductive material and the dielectric layer in accordance with some embodiments.

FIG. 6 illustrates a second planarization process (represented in FIG. 6 by the arrow labeled 600) used to planarize the first conductive material 503 and the first dielectric layer 119 and to isolate the first conductive material 503 within the openings of the first dielectric layer 119. In an embodiment the second planarization process 600 may be performed similar to the first planarization process 200 (described above with respect to FIG. 2). For example, a chemical mechanical polishing process that utilizes the platen 201 along with the CMP slurry 203 may be utilized, although any suitable planarization process, such as simple mechanical grinding or a series of one or more etches, may alternatively be utilized.

However, because the second planarization process 600 is utilized to planarize both the first dielectric layer 119 as well as the first conductive material 503 (and its associated second seed layer 501), the parameters of the second planarization process 600 may be the same as (if appropriate) or different than the parameters of the first planarization process 200. For example, in the second planarization process 600, the platen 201 may be rotated at a speed of between about 20 rpm and about 600 rpm, such as about 100 rpm. Further, the CMP slurry 203 may utilize an etchant such as hydrogen peroxide at a concentration of less than about 5%, such as about 0.5%, and comprise abrasives such as silica, alumina and ceria at a concentration of between about 0.2% and about 5%, such as about 0.5%. However, any suitable parameters for the second planarization process 600 may alternatively be utilized.

The second planarization process 600 is used to remove the first conductive material 503 from over the first dielectric layer 119 as well as to planarize the first dielectric layer 119 in order to reset the planarity of the structure. As such, the first dielectric layer 119 may be thinned to a fourth thickness $T_4$ of between about 0.5 µm and about 10 µm, such as about 5 µm. However, any suitable thickness may alternatively be utilized.

Figure 7:
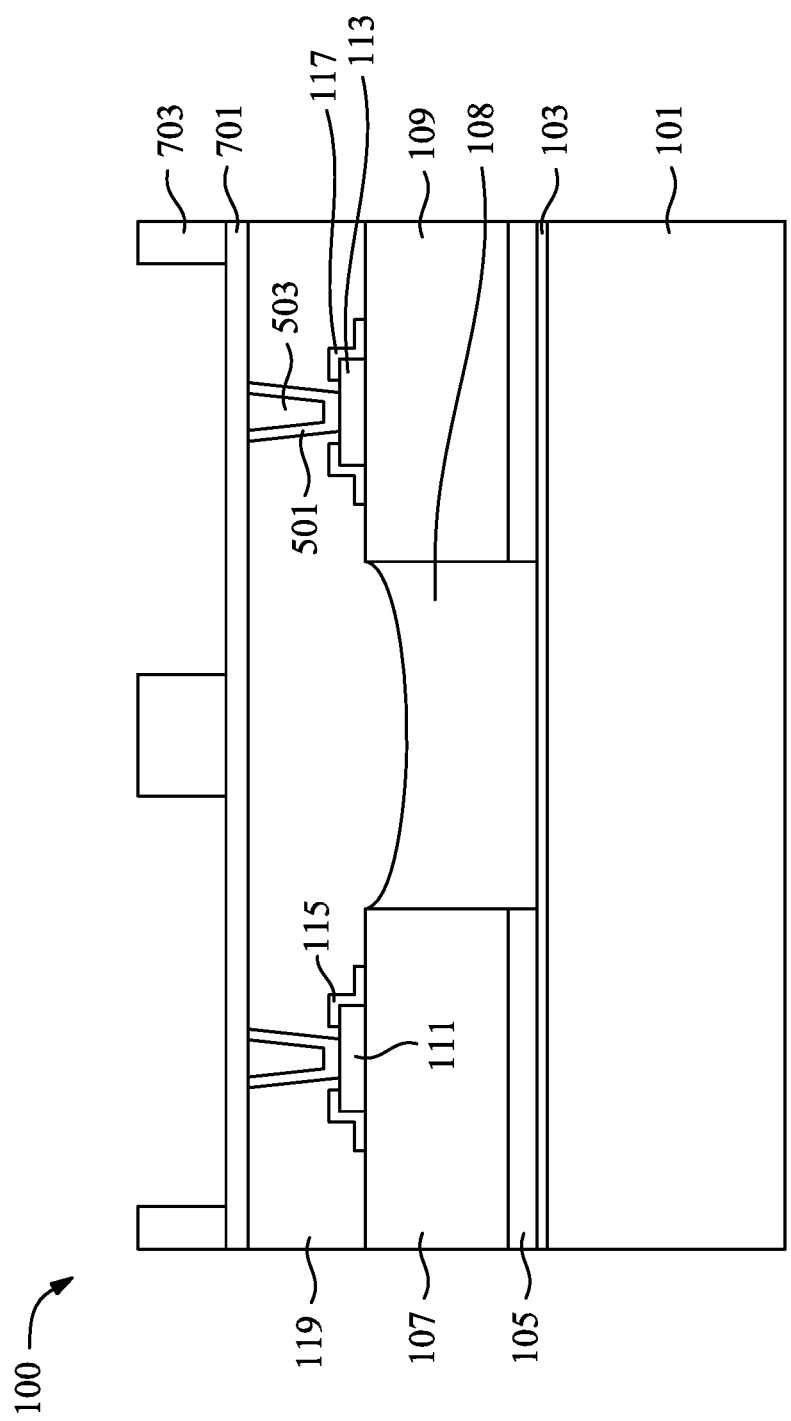
FIG. 7 illustrates a formation of a seed layer over the conductive material in accordance with some embodiments.

FIG. 7 illustrates a formation of a third seed layer 701 over the first dielectric layer 119 and also over and in electrical connection with the first conductive material 503 within the first dielectric layer 119. In an embodiment the third seed layer 701 may be formed using similar materials and similar processes as the first seed layer 301, such as being a material such as titanium and copper formed using a process such as sputtering. However, any suitable material or method of formation may alternatively be utilized.

FIG. 7 also illustrates a formation of a second photoresist 703 over the third seed layer 701. In an embodiment the second photoresist 703 may be formed using similar materials and similar processes as the first photoresist 303 (described above with respect to FIG. 3). For example, the second photoresist 703 may be applied, exposed, and developed to form a shape for a second redistribution layer 801 (not illustrated in FIG. 7 but illustrated and described below with respect to FIG. 8). However, any suitable material or process that can be used to mask the third seed layer 701 may alternatively be utilized.

Figure 8:
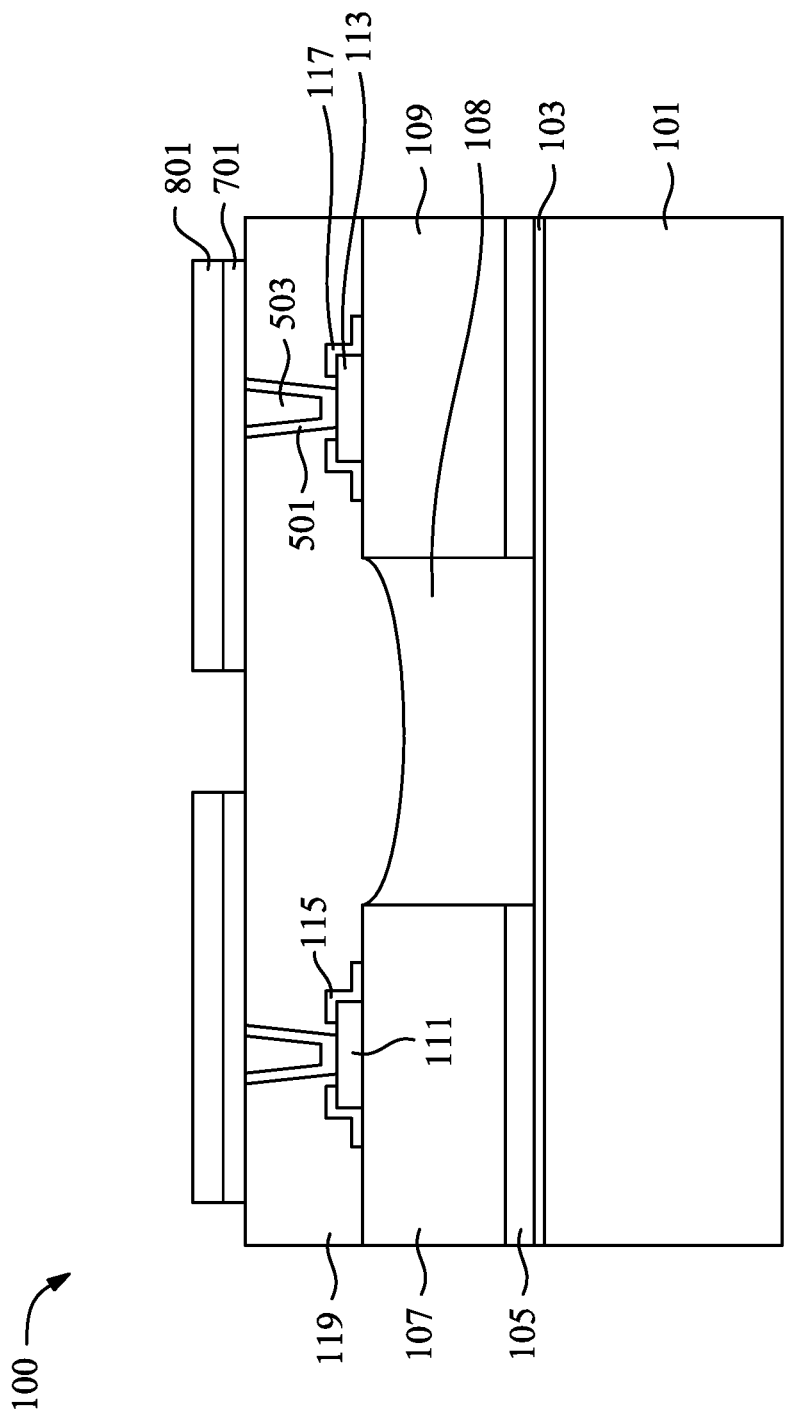
FIG. 8 illustrates a formation of a redistribution layer in accordance with some embodiments.

FIG. 8 illustrates that, once the second photoresist 703 has been applied and patterned to expose portions of the third seed layer 701, the second redistribution layer 801 may be formed on top of the exposed portions of the third seed layer 701. In an embodiment the second redistribution layer 801 may be formed of similar materials and using similar processes as the first redistribution layer 401 (described above with respect to FIG. 4). For example, the second redistribution layer 801 may be formed of a material such as copper using a process such as plating or electroplating, although any suitable material and process may alternatively be utilized.

Once the second redistribution layer 801 has been formed using the second photoresist 703 and the third seed layer 701, the second photoresist 703 may be removed using a suitable removal process. In an embodiment, a plasma ashing process may be used to remove the second photoresist 703, whereby the temperature of the second photoresist 703 may be increased until the second photoresist 703 experiences a thermal decomposition and may be removed. However, any other suitable process, such as a wet strip, may alternatively be utilized. The removal of the second photoresist 703 may expose the underlying portions of the third seed layer 701.

After the removal of the second photoresist 703 exposes the underlying third seed layer 701, these portions of the third seed layer 701 are removed. In an embodiment the exposed portions of the third seed layer 701 (e.g., those portions that are not covered by the second redistribution layer 801) may be removed by, for example, a wet or dry etching process. For example, in a dry etching process reactants may be directed towards the third seed layer 701, using the second redistribution layer 801 as a mask. Alternatively, etchants may be sprayed or otherwise put into contact with the third seed layer 701 in order to remove the exposed portions of the third seed layer 701.

After the second redistribution layer 801 has been formed, additional manufacturing may be performed over the second redistribution layer 801. In an embodiment, a third passivation layer may be formed to cover and protect the second redistribution layer 801, openings may be formed to portions of the second redistribution layer 801, and external contacts such as solder balls or copper pillars may be placed in electrical connection with the second redistribution layer 801 to provide electrical connection to external devices such as printed circuit boards or other packages with other semiconductor devices.

Additionally, the carrier substrate 101 may be removed and further processing may be performed on an opposite side of the first semiconductor device 107 and the second semiconductor device 109 from the second redistribution layer 801. For example, additional metallization and redistribution layers may be formed over the back side of the first semiconductor device 107 and the second semiconductor device 109, and external connections may be formed in physical or electrical connection with the additional metallization and redistribution layers over the back side of the first semiconductor device 107 and the second semiconductor device 109. However, any suitable processing may be performed, and all such processing is fully intended to be included within the scope of the embodiments.

By utilizing the second planarization process 600 to planarize the first dielectric layer 119 and the first conductive material 503, the unevenness of the first dielectric layer 119 caused by the underlying issues with step heights and the encapsulant 108 may be mitigated. Additionally, by mitigating the unevenness of the first dielectric layer 119, the planarity of the overall structure may be reset. Such a reset helps to ensure that overlying structures will be formed on a planar surface, and imperfections associated with non-planar structures can be mitigated.

Figure 9:
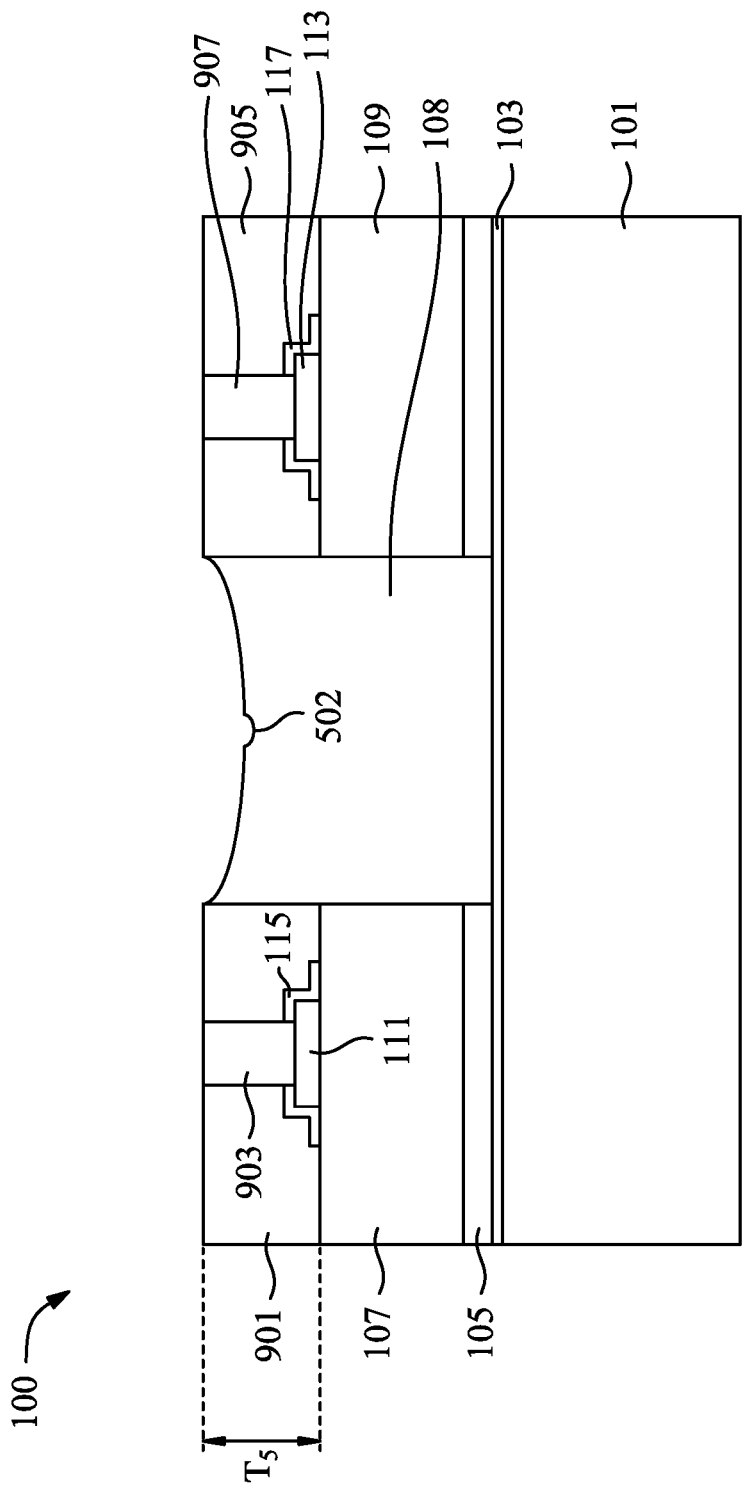
FIG. 9 illustrates a compression or immersion molding process in accordance with some embodiments.

FIG. 9 illustrates that, while the process described above with respect to FIGS. 1-8 have been described with respect to a transfer or laminate molding process, this was intended to be illustrative and is not intended to be limiting. Rather, any suitable molding process, such as a compression molding process (or immersion molding process) may alternatively be used. In one such embodiment, prior to encapsulation, a first conductive connector 903 is formed over the first contact pad 111, and a second dielectric layer 901 is formed over the first conductive connector 903.

In an embodiment, the first conductive connector 903 may be formed by initially applying a seed layer (not separately illustrated in FIG. 9) along the exposed surfaces, and then placing and patterning a mask (also not separately illustrated in FIG. 9) such as a photoresist over the seed layer. Once the mask has been formed to expose portions of the seed layer where the first conductive connector 903 is desired, a conductive material such as copper may be plated onto the exposed seed layer, thereby filling the openings formed within the mask. The mask may then be removed.

Once the first conductive connector 903 has been formed, the second dielectric layer 901 may be formed over the first conductive connector 903. In an embodiment the second dielectric layer 901 may be similar to the first dielectric layer 119, such as by being a photosensitive polybenzoxazole (PBO) applied using a spin coating process, although any suitable material or method of manufacture may be used.

A third dielectric layer 905 and a second conductive connector 907 may be formed on the second semiconductor device 109 using similar material and methods as described above with respect to the second dielectric layer 901 and the first conductive connector 903, respectively. For example, the second conductive connector 907 may be formed within the third dielectric layer 905 and in electrical contact with the second contact pad 113 and the third dielectric layer 905 may be PBO that has been formed over the second conductive connector 907. However, any suitable material and method of manufacture may be utilized for the second conductive connector 907.

Once the second dielectric layer 901, the third dielectric layer 905, the first conductive connector 903 and the second conductive connector 907 have been formed, the first semiconductor device 107 and the second semiconductor device 109 may be placed on the carrier substrate 101, and may be encapsulated using, e.g., the compression molding process or the immersion molding process. In an embodiment in which a compression molding process is used, the compression molding process may be started by initially placing the first semiconductor device 107 and the second semiconductor device 109 within a cavity of a molding device (not illustrated in FIG. 9), and the cavity may be hermetically sealed.

Once the first semiconductor device 107 and the second semiconductor device 109 are within the cavity, the encapsulant 108 may be placed within the cavity before the cavity is hermetically sealed. In an embodiment the encapsulant 108 may be a molding compound resin such as polyimide, PPS, PEEK, PES, a heat resistant crystal resin, combinations of these, or the like.

In an embodiment, the cavity of the molding device is shaped to place the encapsulant 108 such that it has a thickness that is greater than the first semiconductor device 107 and the second semiconductor device 109 so that the encapsulant 108 fully covers the first semiconductor device 107 and the second semiconductor device 109 and also fills a space between the first semiconductor device 107 and the second semiconductor device 109. Once the encapsulant 108 has been placed into the cavity such that the encapsulant 108 encapsulates the region around and between the first semiconductor device 107 and the second semiconductor device 109, the encapsulant 108 may be cured in order to harden the encapsulant 108 for optimum protection. While the exact curing process is dependent at least in part on the particular material chosen for the encapsulant 108, in an embodiment in which molding compound is chosen as the encapsulant 108, the curing could occur through a process such as heating the encapsulant 108 to between about 100° C. and about 200° C., such as about 150° C. for about 30 minutes to about 2400 minutes, such as about 60 minutes. Additionally, initiators and/or catalysts may be included within the encapsulant 108 to better control the curing process.

However, as one having ordinary skill in the art will recognize, the curing process described above is merely an exemplary process and is not meant to limit the current embodiments. Other curing processes, such as irradiation or even allowing the encapsulant 108 to harden at ambient temperature, may alternatively be used. Any suitable curing process may be used, and all such processes are fully intended to be included within the scope of the embodiments discussed herein.

Once in place and cured, the encapsulant 108 may be planarized to expose the top surfaces of the second dielectric layer 901, the third dielectric layer 905, the first conductive connector 903, and the second conductive connector 907 for further processing. In an embodiment a suitable planarization process, such as a chemical mechanical polishing process, a physical grinding process, or a series of one or more etches may be used to planarize the encapsulant 108 with the second dielectric layer 901, the third dielectric layer 905, the first conductive connector 903, and the second conductive connector 907. In an embodiment the planarization process may be continued until the second dielectric layer 901 has a fifth thickness $T_5$ of between about 5 µm and about 30 µm, such as about 20 µm, although any suitable thickness may be used.

However, because of the differences in materials, such as the differences between the encapsulant 108, the second dielectric layer 901, the third dielectric layer 905, the first conductive connector 903, and the second conductive connector 907, the encapsulant 108 does not finish the process being planar. Rather, in a process known as dishing, a top surface of the encapsulant 108 will have a curved shape extending from the second dielectric later 901 to the third dielectric layer 905. Such a non-planar surface can lead to problems and defects during the manufacturing of subsequent, overlying layers. Additionally, during the compression encapsulation process itself, voids 502 may be formed within the encapsulant 108. During the planarization process such voids 502 may be exposed, further affecting the planarity of the top surface. Voids may also be formed by the planarization process due to lift-off of fillers (e.g., silica) in the encapsulant 108.

Figure 10:
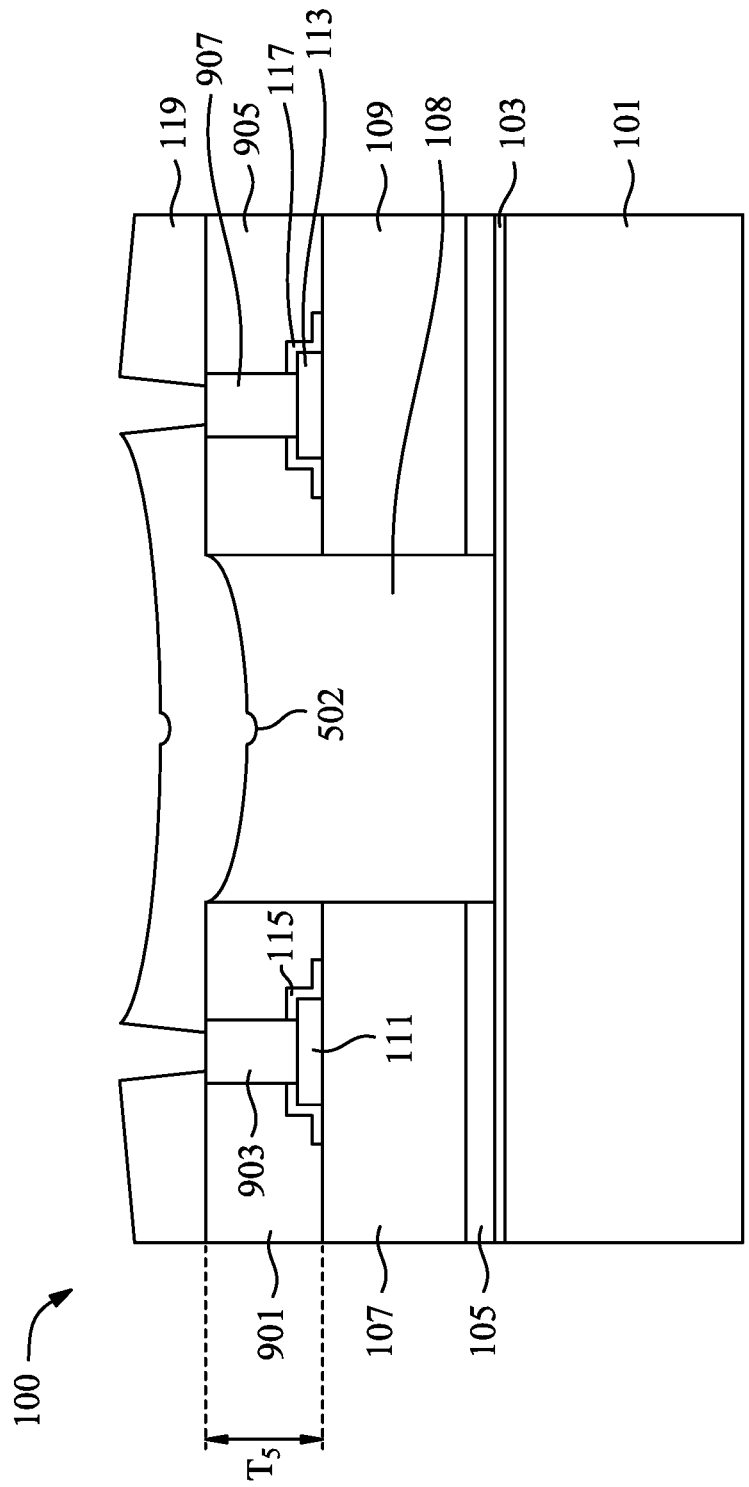
FIG. 10 illustrates a formation of a dielectric layer in accordance with some embodiments.

FIG. 10 illustrates a placement of the first dielectric layer 119 over the second dielectric layer 901 and the third dielectric layer 905. In an embodiment the first dielectric layer 119 may be applied as described above with respect to FIG. 1. For example, the first dielectric layer 119 may be a photosensitive PBO applied using, e.g., a spin coating process and then patterned and developed in order to expose the first conductive connector 903 and the second conductive connector 907. However, due to the non-planar surface of the encapsulant 108, as well as the presence of the voids 502 within the encapsulant 108, the first dielectric layer 119 in this embodiment as well will not have a planar top surface.

Figure 11:
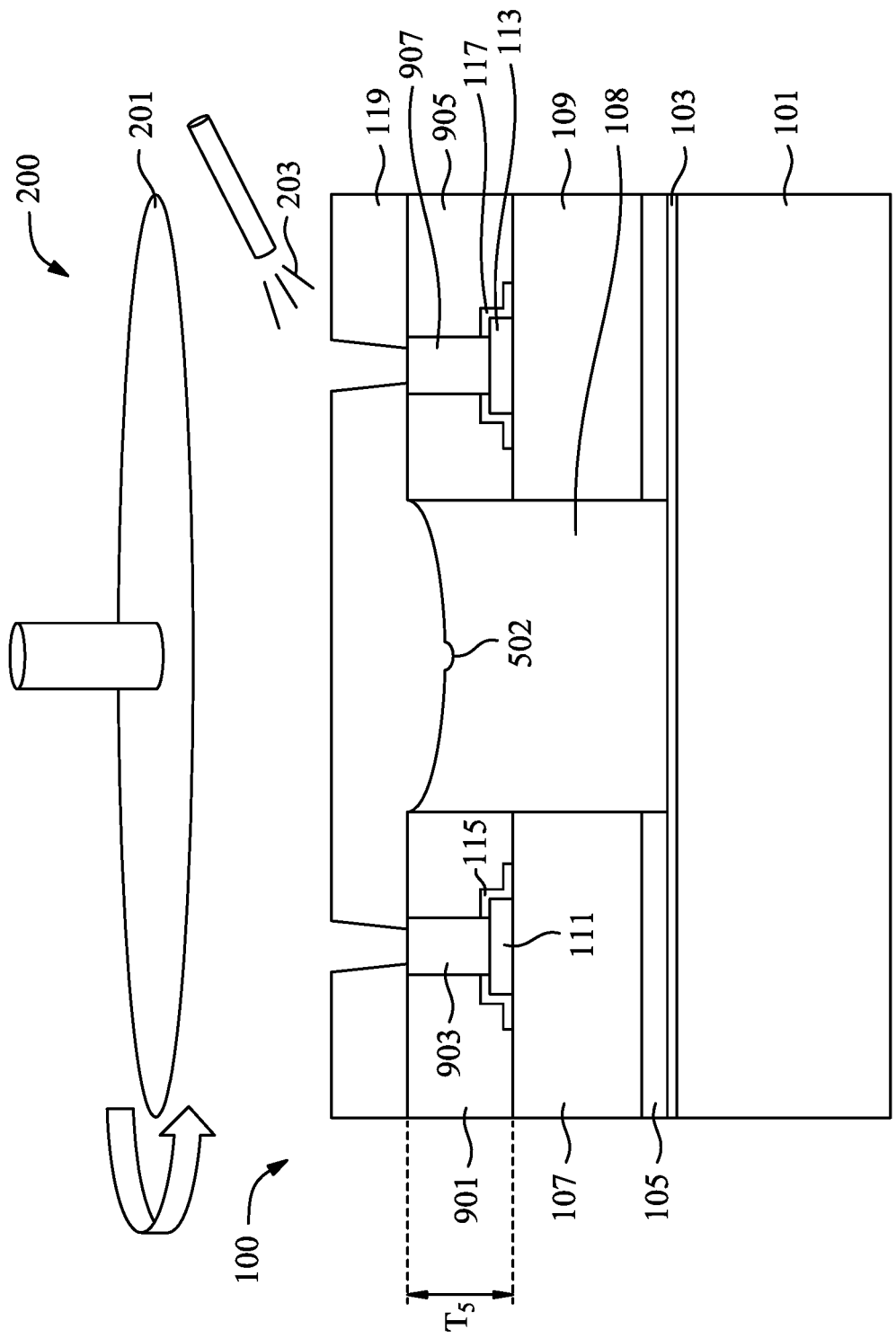
FIG. 11 illustrates a planarization of a dielectric layer in accordance with some embodiments.

FIG. 11 illustrates the use of the first planarization process 200 in order to reset the planarity of the first dielectric layer 119 prior to further processing. In this embodiment the first planarization process 200 may be used as described above with respect to FIG. 2. For example, the platen 201 may be used with the CMP slurry 203 in a chemical mechanical polish to react and grind the first dielectric layer 119 and form a planar top surface that resets the planarity of the first dielectric layer 119.

Figure 12:
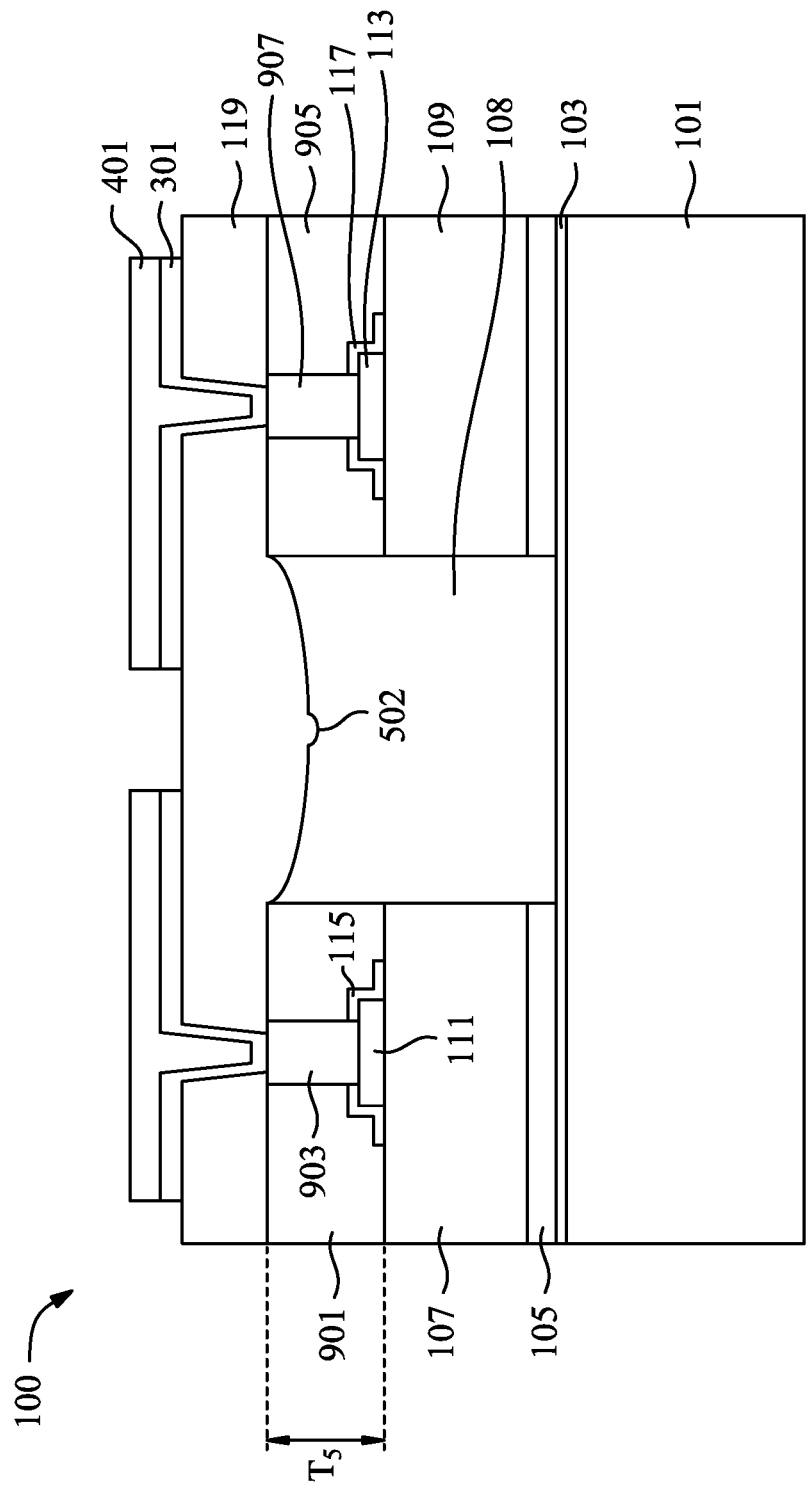
FIG. 12 illustrates a formation of a redistribution layer in accordance with some embodiments.

FIG. 12 illustrates that, once the planarity of the first dielectric layer 119 has been reset, the first redistribution layer 401 may be formed over the first dielectric layer 119 and in electrical connection with the first conductive connector 903 and the second conductive connector 907. In an embodiment the first redistribution layer 401 may be formed as described above with respect to FIGS. 3 and 4. For example, a plasma ashing cleaning process may be used first, followed by a deposition of the first seed layer 301. Once the first seed layer 301 has been formed, the first photoresist 303 (not separately illustrated in FIG. 12) may be placed and patterned over the first seed layer 301 in order to provide a mask for plating the first redistribution layer 401. Once the first photoresist 303 has been placed and patterned, the first redistribution layer 401 is plated onto the exposed portions of the first seed layer 301, the first photoresist 303 is removed, and exposed portions of the first seed layer 301 (not covered by the first redistribution layer 401) is removed using, e.g., an etch process.

Figure 13:
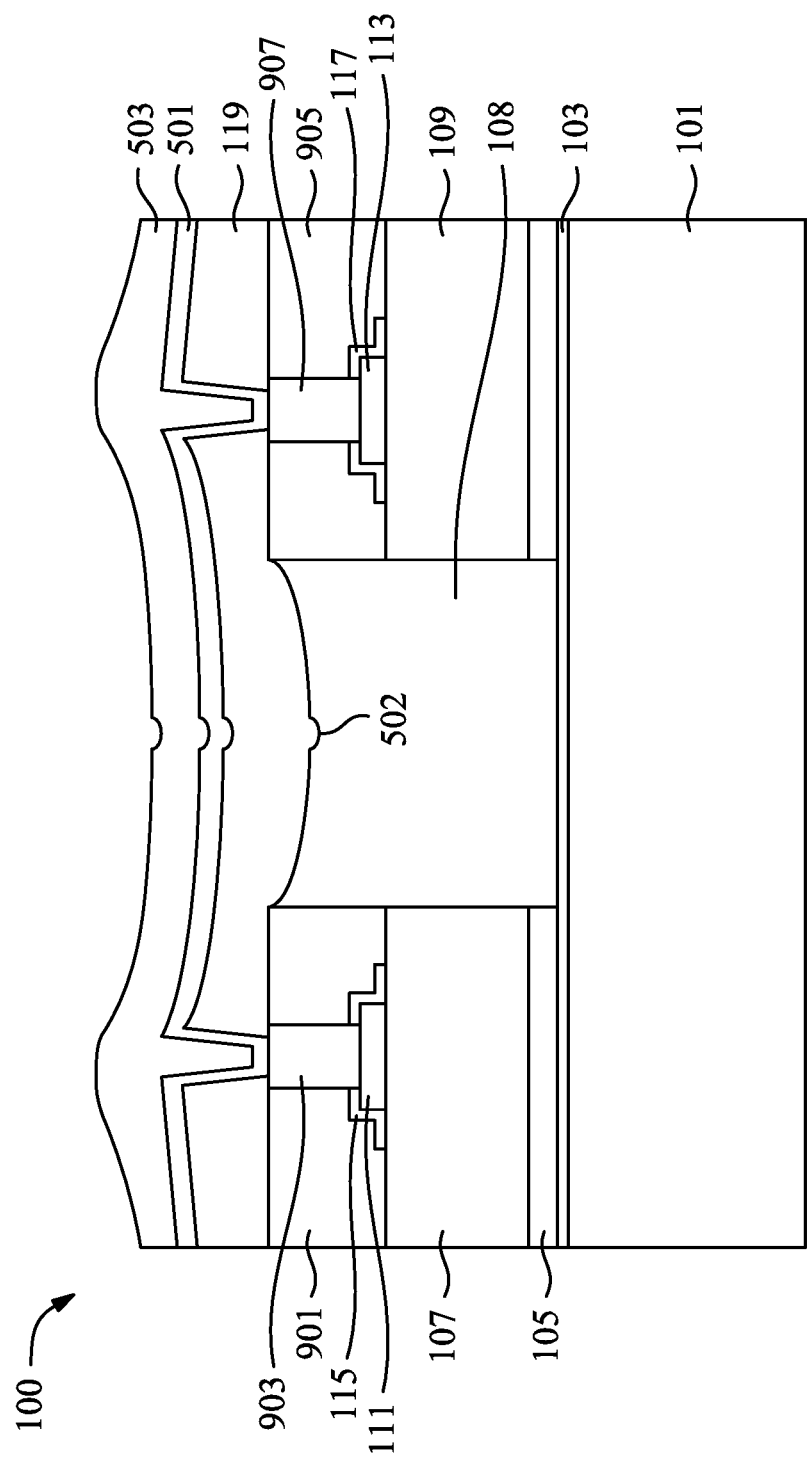
FIG. 13 illustrates a formation of a conductive material over the dielectric layer in accordance with some embodiments.

FIG. 13 illustrates another embodiment that may be utilized to reset the planarity after a compression molding process is utilized to place the encapsulant 108 between the first semiconductor device 107 and the second semiconductor device 109. In an embodiment the second dielectric layer 901 and the third dielectric layer 905 have already been placed over the first contact pad 111 and the second contact pad 113, and the first conductive connector 903 and the second conductive connector 907 have been formed to extend through the second dielectric layer 901 and the third dielectric layer 905 as described above with respect to FIG. 9. However, any suitable structures, combinations of structures, or methods of manufacture may be utilized.

In this embodiment, however, rather than reset the planarity of the first dielectric layer 119 prior to filling the openings formed by the patterning of the first dielectric layer 119, the second seed layer 501 and the first conductive material 503 are formed as described above with respect to FIG. 5 prior to any planarization process being performed on the first dielectric layer 119. For example, the second seed layer 501 may be formed to line the openings through the first dielectric layer 119, and the first conductive material 503 may be formed on the second seed layer 501 using, e.g., a plating process. However, any suitable materials and processes may be utilized to fill and overfill the openings that have been formed through the first dielectric layer 119 to expose the first conductive connector 903 and the second conductive connector 907.

Figure 14:
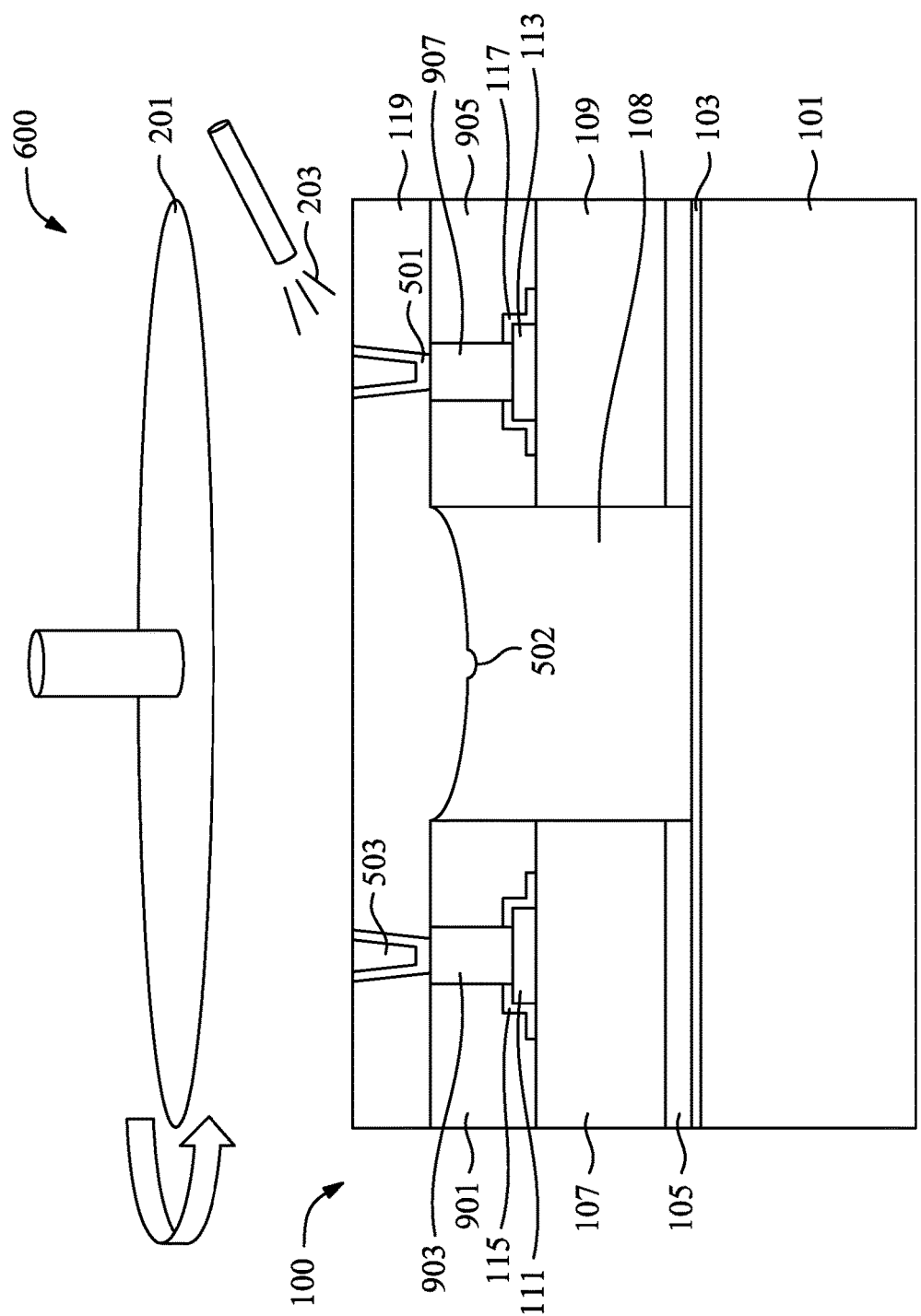
FIG. 14 illustrates a planarization of a dielectric layer in accordance with some embodiments.

FIG. 14 illustrates that, once the second seed layer 501 and the first conductive material 503 have been formed, the second planarization process 600 as described above with respect to FIG. 6 may be performed in order to planarize the first dielectric layer 119, the second seed layer 501, and the first conductive material 503 and to reset the planarity of the structure for further processing. For example, in an embodiment the platen 201 along with the CMP slurry 203 may be utilized in order to react and grind the materials of the first dielectric layer 119, the second seed layer 501 and the first conductive material 503 in order to remove excess portions of the second seed layer 501 and the first conductive material 503 from outside of the openings within the first dielectric layer 119. However, any suitable process of planarization may be utilized in order to reset the planarity of these structures.

Figure 15:
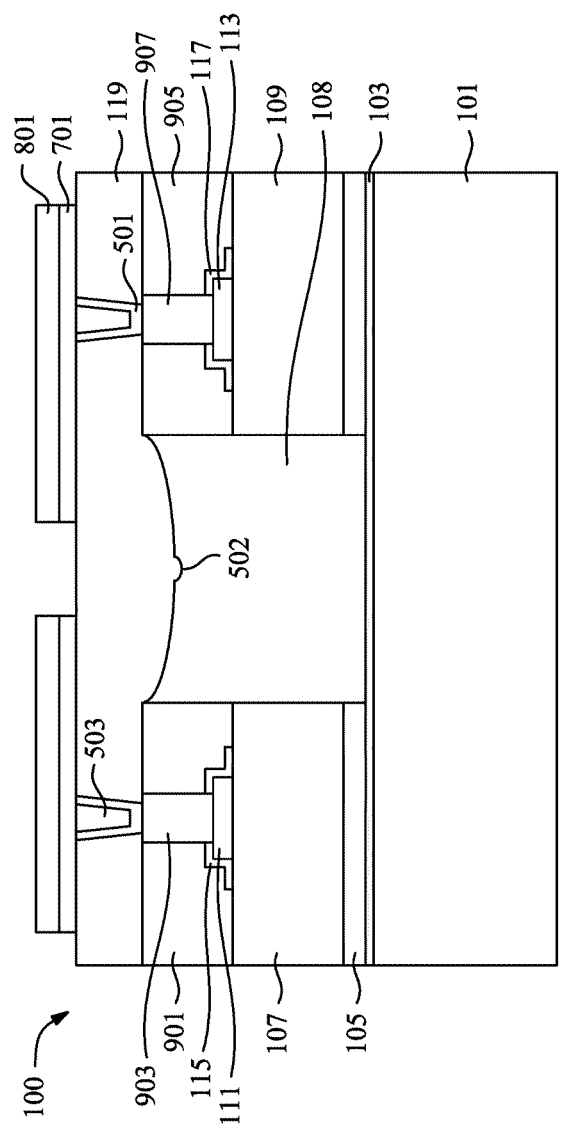
FIG. 15 illustrates a formation of a redistribution layer in accordance with some embodiments.

FIG. 15 illustrates that, once the planarity of the first dielectric layer 119 has been reset in this embodiment, the second redistribution layer 801 may be formed over the first dielectric layer 119 and in electrical connection with the first conductive material 503 within the first dielectric layer 119. In an embodiment the second redistribution layer 801 may be formed as described above with respect to FIGS. 7 and 8. For example, a plasma ashing cleaning process may be used first, followed by a deposition of the third seed layer 701. Once the third seed layer 701 has been formed, the second photoresist 703 (not separately illustrated in FIG. 15) may be placed and patterned over the third seed layer 701 in order to provide a mask for plating the second redistribution layer 801. Once the second photoresist 703 has been placed and patterned, the second redistribution layer 801 is plated onto the exposed portions of the third seed layer 701, the second photoresist 703 is removed, and exposed portions of the third seed layer 701 (not covered by the second redistribution layer 801) are removed using, e.g., an etch process.

By resetting the planarity of the first dielectric layer 119, a smoother surface is present for subsequent processing operations. By forming a more planar surface, defects and problems that can occur from a non-planar surface as dimensions are further reduced may be mitigated or eliminated. As such, more reliable devices can be made with fewer defects and a larger yield.

The embodiments discussed above, which are illustrated utilizing the first semiconductor device 107 and the second semiconductor device 109, are intended to be illustrative only and are not intended to be limiting upon the embodiments. Rather, the embodiments described herein may be implemented in a wide range of embodiments, such as other fan-out wafer level packages, integrated fan out wafer level packages, or the like. All such embodiments are fully intended to be included within the scope of the embodiments.

In accordance with an embodiment, a method of manufacturing a semiconductor device comprising encapsulating a first semiconductor device and a second semiconductor device with an encapsulant is provided. A dielectric material is applied over the first semiconductor device and the second semiconductor device after the encapsulating the first semiconductor device and the second semiconductor device. The dielectric material is planarized after the applying the dielectric material, and a redistribution layer is formed over the dielectric material after the planarizing the dielectric material, wherein the redistribution layer is in electrical connection with the first semiconductor device and the second semiconductor device.

In accordance with another embodiment, a method of manufacturing a semiconductor device comprising encapsulating a first semiconductor device and a second semiconductor device with an encapsulant is provided. A dielectric material is applied over the first semiconductor device, the second semiconductor device, and the encapsulant, wherein the dielectric material has a non-planar surface facing away from the first semiconductor device and the second semiconductor device. The dielectric material is patterned to form a first opening to a first contact on the first semiconductor device and a second opening to a second contact on the second semiconductor device. The first opening and the second opening are filled with a conductive material, and the dielectric material and the conductive material are planarized, wherein after the planarizing the dielectric material and the conductive material the conductive material is isolated within the dielectric material and the dielectric material has an increased planarity.

In accordance with yet another embodiment, a method of manufacturing a semiconductor device comprising applying a photosensitive polybenzoxazole over a first semiconductor device, a second semiconductor device, and an encapsulant between the first semiconductor device and the second semiconductor device, wherein the photosensitive polybenzoxazole has a non-planar surface after the applying the photosensitive polybenzoxazole, is provided. The photosensitive polybenzoxazole is patterned to form an opening through the photosensitive polybenzoxazole, and the planarity of the photosensitive polybenzoxazole is reset using a planarization process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   encapsulating a first semiconductor device and a second semiconductor device with an encapsulant;
   applying a dielectric material over the first semiconductor device and the second semiconductor device after the encapsulating the first semiconductor device and the second semiconductor device, the dielectric material having a non-planar surface facing away from the first semiconductor device and the second semiconductor device;
   patterning the dielectric material to form a first opening exposing a first contact on the first semiconductor device and a second opening exposing a second contact on the second semiconductor device;
   forming a conductive material in the first opening, in the second opening, and extending along the non-planar surface of the dielectric material;
   planarizing the dielectric material after the applying the dielectric material, the planarizing removing the non-planar surface of the dielectric material and portions of the conductive material extending along the non-planar surface of the dielectric material; and
   forming a redistribution layer over the dielectric material after the planarizing the dielectric material, wherein the redistribution layer is in electrical connection with the first semiconductor device and the second semiconductor device.

2. The method of claim 1, wherein the forming the redistribution layer forms the redistribution layer in electrical contact with the first contact and the second contact.

3. The method of claim 2, wherein the patterning the dielectric material further comprises exposing the dielectric material to a patterned energy source.

4. The method of claim 3, wherein the patterning the dielectric material further comprises developing the dielectric material.

5. The method of claim 1, wherein the encapsulating the first semiconductor device and the second semiconductor device is performed using a compression, transfer or immersion molding process.

6. The method of claim 5, further comprising performing a second planarization process when the encapsulating the first semiconductor device and the second semiconductor device is performed using a compression or immersion molding process.

7. The method of claim 1, wherein the forming the redistribution layer further comprises:
   forming a seed layer within an opening of the dielectric material; and
   plating a conductive material within the opening of the dielectric material.

8. A method of manufacturing a semiconductor device, the method comprising:
   encapsulating a first semiconductor device and a second semiconductor device with an encapsulant;
   applying a dielectric material over the first semiconductor device, the second semiconductor device, and the encapsulant, wherein the dielectric material has a non-planar surface facing away from the first semiconductor device and the second semiconductor device;
   patterning the dielectric material to form a first opening to a first contact on the first semiconductor device and a second opening to a second contact on the second semiconductor device;
   forming a conductive material over the dielectric material, the conductive material having a first portion filling the first opening, a second portion filling the second opening, and a third portion extending along the non-planar surface of the dielectric material; and
   planarizing the dielectric material and the conductive material such that top surfaces of the dielectric material, the first portion of the conductive material, and the second portion of the conductive material are level, wherein, after the planarizing the dielectric material and the conductive material, the third portion of the conductive material is removed, the first portion of the conductive material is isolated from the second portion of the conductive material within the dielectric material, and the dielectric material has an increased planarity.

9. The method of claim 8, wherein the encapsulating the first semiconductor device and the second semiconductor device is performed using a transfer molding process, an immersion molding process, or a compression molding process.

10. The method of claim 9, further comprising planarizing the encapsulant when the encapsulating the first semiconductor device and the second semiconductor device is performed using an immersion molding process or a compression molding process.

11. The method of claim 8, further comprising forming a redistribution layer over the dielectric material.

12. The method of claim 11, further comprising:
   depositing a seed layer over the dielectric material, the first contact, and the second contact, wherein at least a portion of the seed layer is planar and parallel with a major surface of the first semiconductor device; and
   plating the redistribution layer onto the seed layer.

13. The method of claim 8, wherein the dielectric material is a photosensitive polybenzoxazole.

14. The method of claim 13, wherein the patterning the dielectric material further comprises:
- exposing the dielectric material to a patterned energy source; and
- developing the dielectric material.

15. A method of manufacturing a semiconductor device, the method comprising:
- applying a photosensitive polybenzoxazole over a first semiconductor device, a second semiconductor device, and an encapsulant between the first semiconductor device and the second semiconductor device, wherein the photosensitive polybenzoxazole has a non-planar surface after the applying the photosensitive polybenzoxazole;
- patterning the photosensitive polybenzoxazole to form an first opening and a second opening through the photosensitive polybenzoxazole;
- forming a first conductive material in the first opening, in the second opening, and extending along the non-planar surface of the photosensitive polybenzoxazole; and
- resetting the planarity of the photosensitive polybenzoxazole using a planarization process, the planarization process removing the non-planar surface of the photosensitive polybenzoxazole and portions of the first conductive material extending along the non-planar surface of the photosensitive polybenzoxazole, wherein top surfaces of the first conductive material in the first opening, the first conductive material in the second opening, and the photosensitive polybenzoxazole are level after the planarization process.

16. The method of claim 15, further comprising depositing a seed layer into the first opening and the second opening after the resetting the planarity of the photosensitive polybenzoxazole.

17. The method of claim 15, further comprising depositing the first conductive material into the first opening and the second opening prior to the resetting the planarity of the photosensitive polybenzoxazole.

18. The method of claim 17, further comprising filling the first opening and the second opening with a second conductive material prior to resetting the planarity of the photosensitive polybenzoxazole.

19. The method of claim 18, further comprising forming a redistribution layer over the photosensitive polybenzoxazole and in electrical connection with the second conductive material.

20. The method of claim 15, wherein the resetting the planarity of the photosensitive polybenzoxazole further comprises performing a chemical mechanical polishing process.

* * * * *